United States Patent
Shih et al.

(10) Patent No.: US 10,327,547 B1
(45) Date of Patent: Jun. 25, 2019

(54) CASE WITH STOPPING DEVICE

(71) Applicant: HONGFUJIN PRECISION ELECTRONICS (TIANJIN) CO., LTD., Tianjin (CN)

(72) Inventors: Tung-Ho Shih, New Taipei (TW); Yao-Chih Liu, New Taipei (TW)

(73) Assignee: HONGFUJIN PRECISION ELECTRONICS(TIANJIN)CO., LTD., Tianjin (CN)

( * ) Notice: Subject to any disclaimer, the term of this patent is extended or adjusted under 35 U.S.C. 154(b) by 0 days.

(21) Appl. No.: 15/916,383

(22) Filed: Mar. 9, 2018

(30) Foreign Application Priority Data

Dec. 27, 2017 (CN) .......................... 2017 1 1445980

(51) Int. Cl.
| | |
|---|---|
| H05K 5/02 | (2006.01) |
| H05K 7/14 | (2006.01) |
| A47B 88/48 | (2017.01) |
| A47B 88/57 | (2017.01) |
| E05C 17/48 | (2006.01) |
| A47B 88/473 | (2017.01) |

(52) U.S. Cl.
CPC ............ *A47B 88/473* (2017.01); *A47B 88/48* (2017.01); *H05K 5/0221* (2013.01); *H05K 7/1488* (2013.01); *A47B 88/57* (2017.01); *E05C 17/48* (2013.01)

(58) Field of Classification Search
CPC ..... H05K 5/0221; H05K 7/1488; E05C 17/48
See application file for complete search history.

(56) References Cited

U.S. PATENT DOCUMENTS

| | | | | |
|---|---|---|---|---|
| 6,381,138 B1* | 4/2002 | Chen | ........................ | G06F 1/181 |
| | | | | 312/223.2 |
| 2009/0290322 A1* | 11/2009 | Chang | ................... | H05K 5/0221 |
| | | | | 361/837 |
| 2013/0094156 A1* | 4/2013 | Wang | ...................... | G06F 1/188 |
| | | | | 361/747 |
| 2014/0254106 A1* | 9/2014 | Baquiano | .............. | H05K 5/0221 |
| | | | | 361/726 |
| 2015/0062796 A1* | 3/2015 | Yu | ........................... | G06F 1/181 |
| | | | | 361/679.31 |
| 2015/0076839 A1* | 3/2015 | Eckberg | ..................... | E05C 3/14 |
| | | | | 292/219 |
| 2015/0362121 A1* | 12/2015 | Tseng | .................... | H05K 5/0221 |
| | | | | 248/544 |
| 2017/0150634 A1* | 5/2017 | Huang | ................. | H05K 7/1489 |

* cited by examiner

*Primary Examiner* — Daniel J Rohrhoff
(74) *Attorney, Agent, or Firm* — ScienBiziP, P.C.

(57) ABSTRACT

A case includes a shell, a sliding member, and an operating member. The shell defines a through hole. The sliding member includes an abutting portion. The operating member is rotatably fixed to the shell and slidably connected to the sliding member. The operating member rotates in a first direction to drive the sliding member to slide in a second direction and the abutting portion abuts the stopping portion to be pushed out of the through hole. The operating member rotates in a direction opposite to the first direction to drive the sliding member to slide in a direction opposite to the second direction and the stopping portion moves into the through hole.

20 Claims, 6 Drawing Sheets

US 10,327,547 B1

CASE WITH STOPPING DEVICE

CROSS-REFERENCE TO RELATED APPLICATIONS

This application claims priority to Chinese Patent Application No. 201711445980.6, filed on Dec. 27, 2017, the contents of which are incorporated by reference herein.

FIELD

The subject matter herein generally relates to cases, especially relates to a case having a stopping device.

BACKGROUND

Data centers include cabinets and a number of servers received in the cabinet. The server includes a stopping structure on the cabinet to prevent a server from sliding out of the cabinet. The stopping structure is pressed to lock or unlock to the cabinet.

BRIEF DESCRIPTION OF THE DRAWINGS

Implementations of the present technology will now be described, by way of example only, with reference to the attached figures.

DETAILED DESCRIPTION

Figure 1:
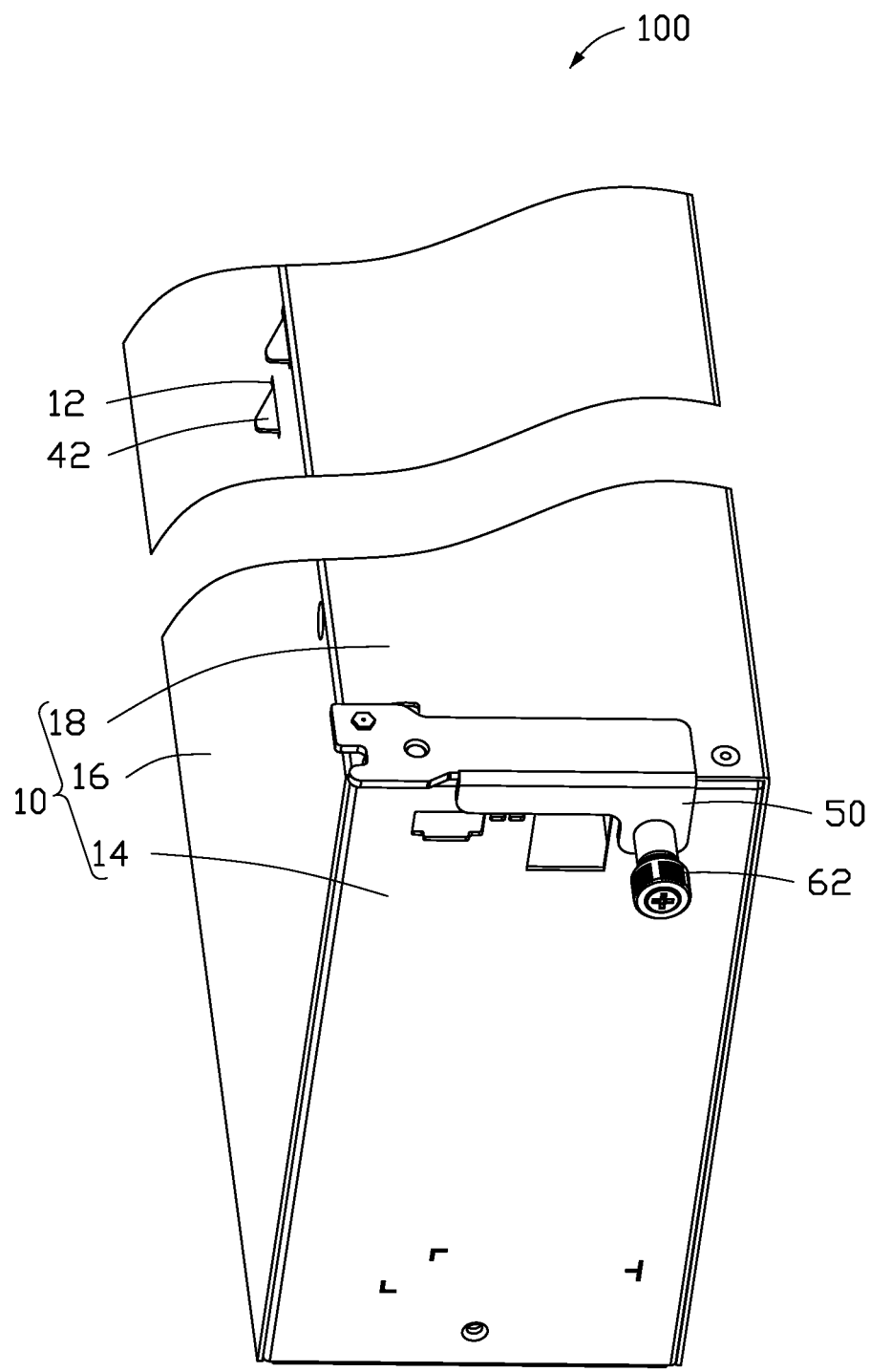
FIG. 1 is an isometric view of an exemplary embodiment of a case.
Figure 2:
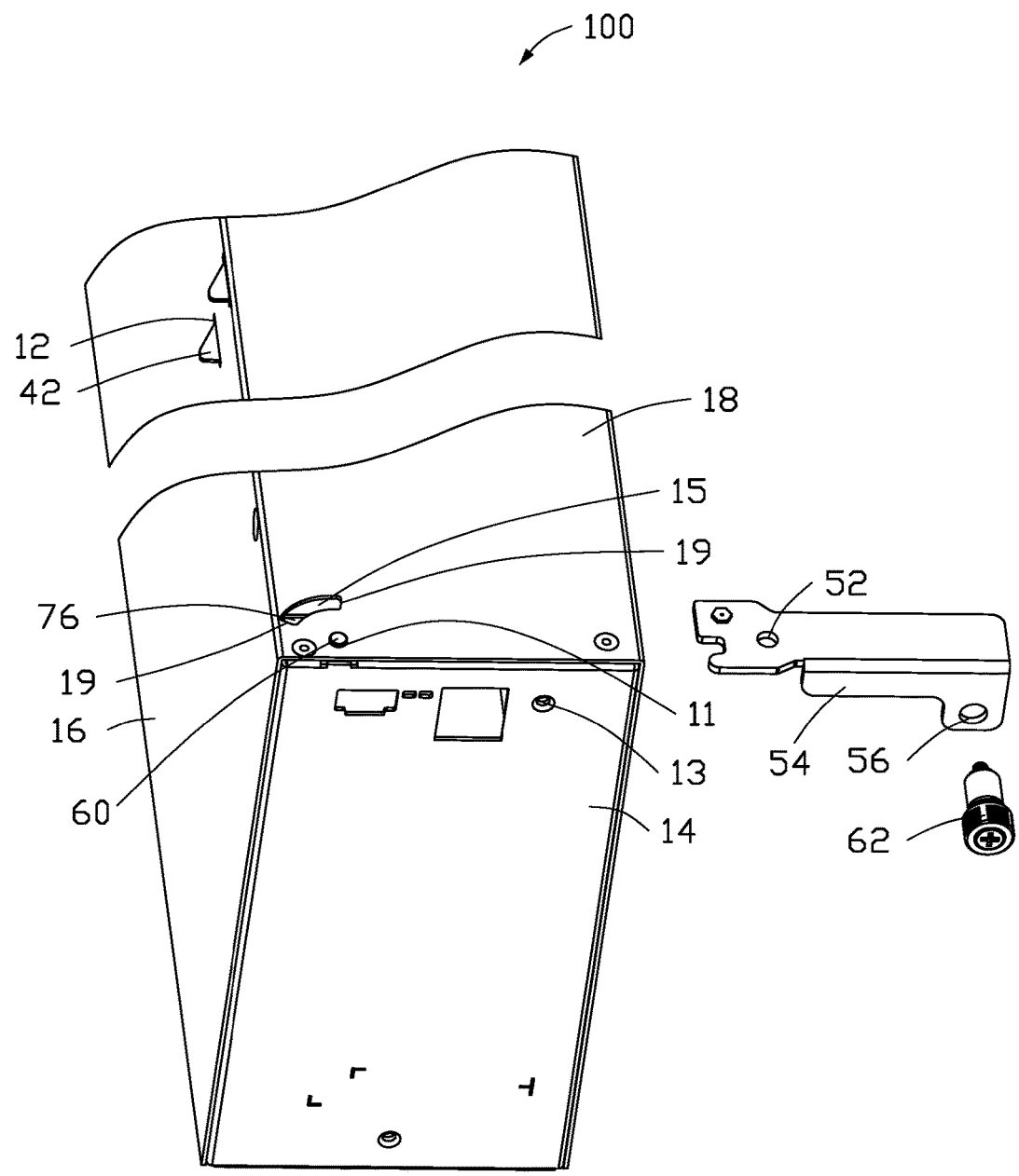
FIG. 2 is an exploded view of the case in FIG. 1.
Figure 3:
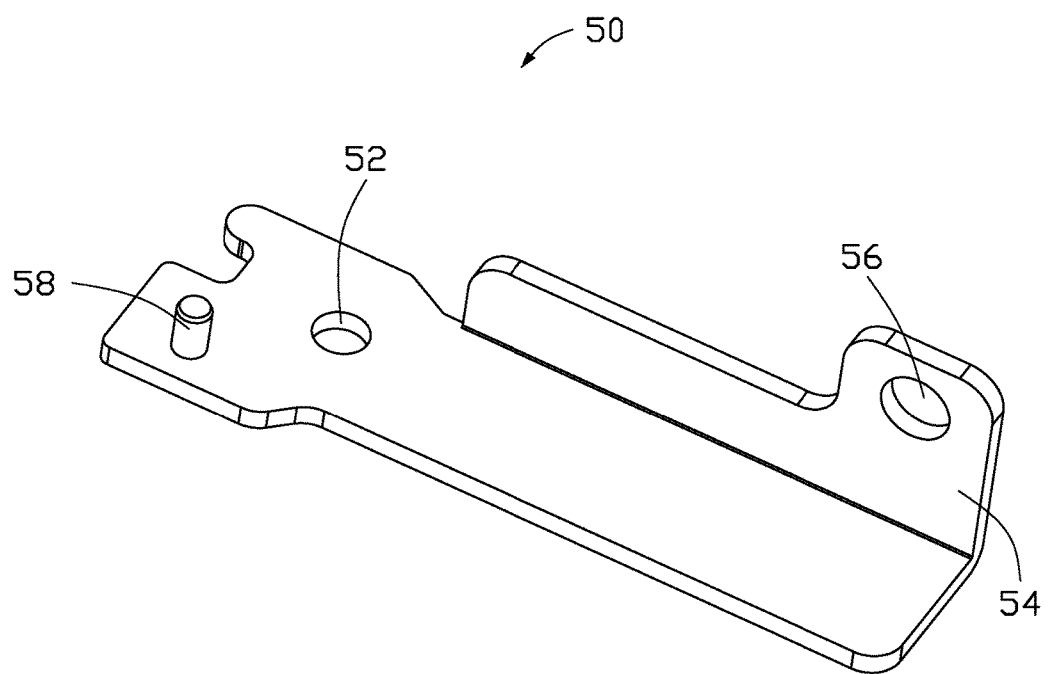
FIG. 3 is an isometric view of an operating member in the case of FIG. 1.

It will be appreciated that for simplicity and clarity of illustration, where appropriate, reference numerals have been repeated among the different figures to indicate corresponding or analogous elements. In addition, numerous specific details are set forth in order to provide a thorough understanding of the exemplary embodiments described herein. However, it will be understood by those of ordinary skill in the art that the exemplary embodiments described herein can be practiced without these specific details. In other instances, methods, procedures, and components have not been described in detail so as not to obscure the related relevant feature being described. The drawings are not necessarily to scale and the proportions of certain parts may be exaggerated to better illustrate details and features. The description is not to be considered as limiting the scope of the exemplary embodiments described herein. The disclosure is illustrated by way of example and not by way of limitation in the figures of the accompanying drawings, in which like references indicate similar elements. It should be noted that references to "an" or "one" exemplary embodiment in this disclosure are not necessarily to the same exemplary embodiment, and such references mean "at least one."

The term "comprising" means "including, but not necessarily limited to"; it specifically indicates open-ended inclusion or membership in a so-described combination, group, series, and the like.

FIG. 1 illustrates a case 100 including a shell 10 and a stopping device (not labeled). The shell 10 defines a through hole 12. The stopping device includes an elastic stopping member 40. The stopping member 40 includes a stopping portion 42. The stopping portion 42 is opposite to the through hole 12. The stopping portion 42 passes though the though hole 12 and is exposed from the case 100. The stopping portion 42 abuts an inner side of cabinet (not shown) to prevent the case 100 from sliding out of the cabinet.

Figure 4:
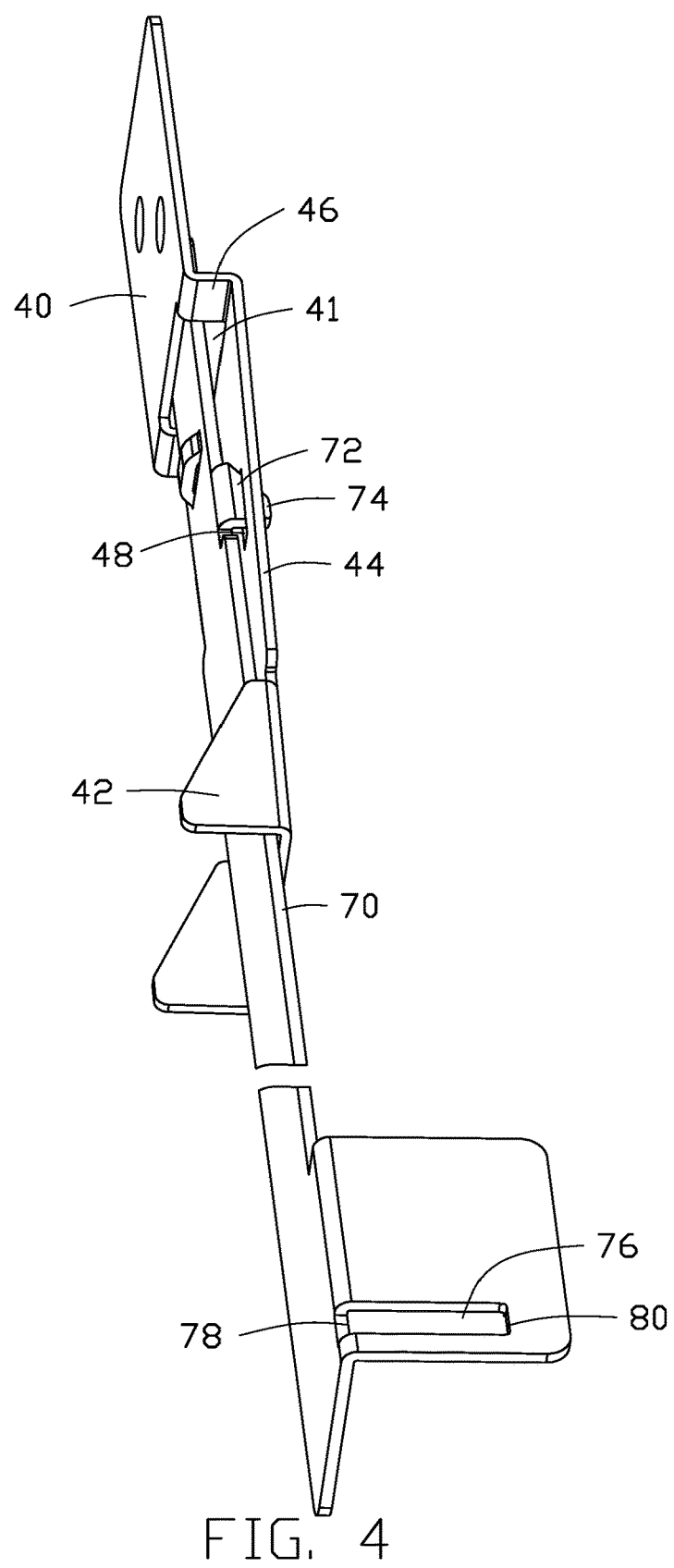
FIG. 4 is an isometric view of a stopping member and a sliding member in FIG. 1.
Figure 5:
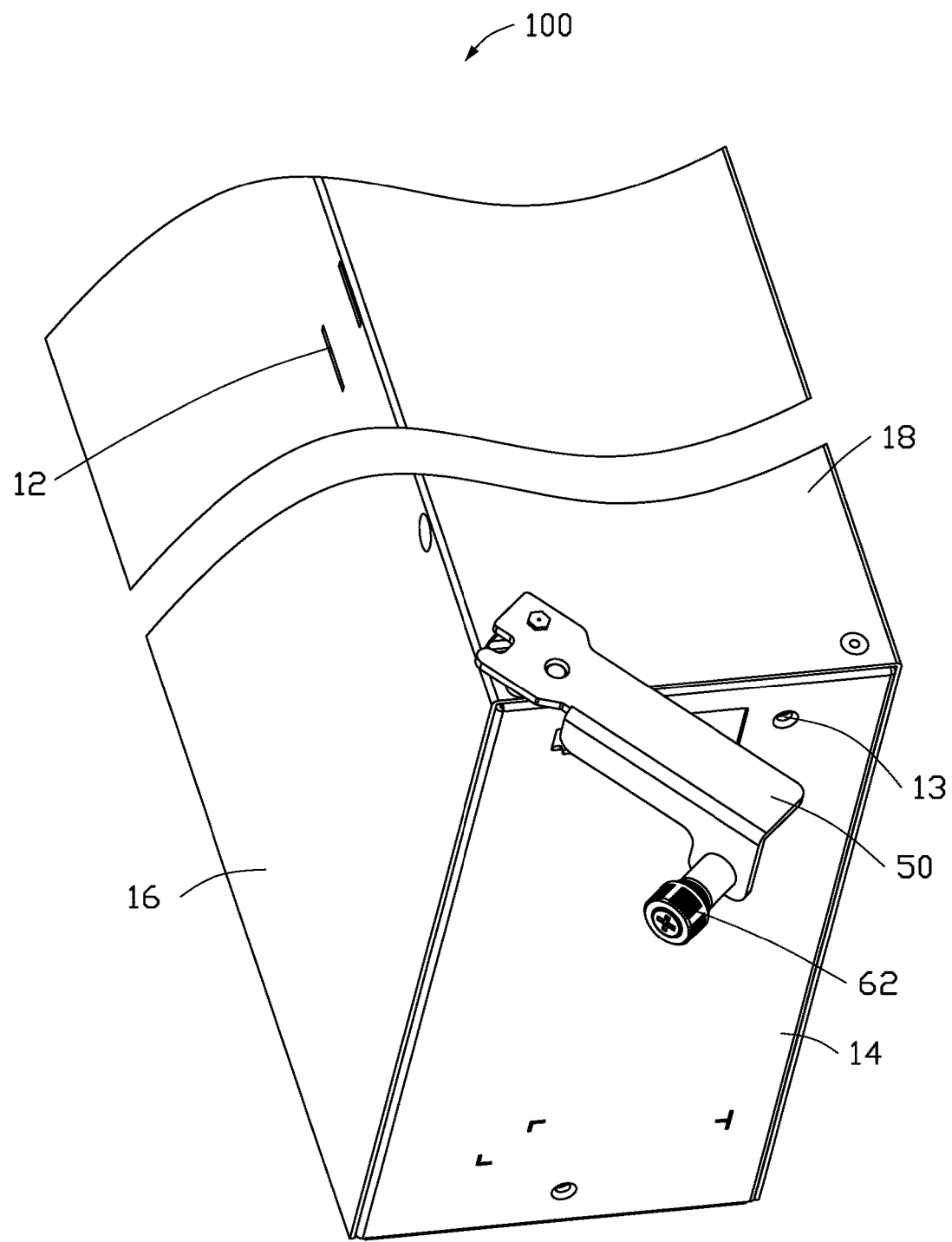
FIG. 5 is similar to FIG. 1, but with a stopping portion retracted in the case.
Figure 6:
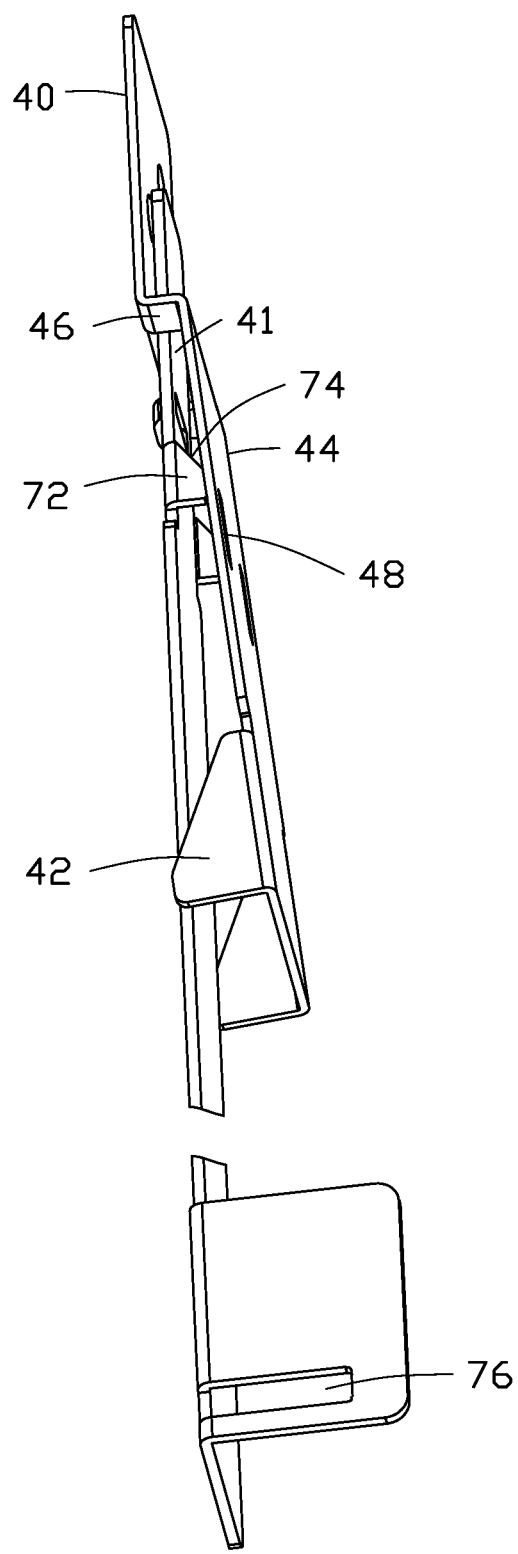
FIG. 6 is an isometric view of the stopping member and the sliding member in FIG. 5.

The stopping device includes an operating member 50 and a sliding member 70 (FIGS. 4, 6). The sliding member 70 includes an abutting portion 72. The operating member 50 is rotatably fixed to the shell 10 and slidably connected to the sliding member 70. The operating member 50 rotates in a first direction to drive the sliding member 70 to slide in a second direction and the abutting portion 72 abuts the stopping portion 42 to push portion 42 out of the through hole 12. The operating member 50 rotates in a direction opposite to the first direction to drive the sliding member 70 to slide in a direction opposite to the second direction and the stopping portion 42 accordingly moves, to pass through and be received in the through hole 12.

The shell 10 includes a front plate 14, a first side plate 16, and a second side plate 18. The first side plate 16 and the second side plate 18 are connected to adjacent sides of the front plate 14. The through hole 12 is defined on the first side plate 16. An end of the second side plate 18 adjacent to the front plate 14 defines a first hole 11. The operating member 50 defines a second hole 52. A rotating shaft 60 is fixed in the first hole 11 and received in the second hole 52. Thus, the operating member 50 can rotate around the rotating shaft 60.

The operating member 50 includes a fixing portion 54. When the operating member 50 rotates to drive the stopping portion 42 to pass through the through hole 12, the fixing portion 54 is fixed to the front plate 14. The fixing portion 54 defines a first fixing hole 56. The front plate 14 defines a second fixing hole 13. When the operating member 50 rotates to drive the stopping portion 42 to pass through the through hole 12, the first fixing hole 56 is aligned to the second fixing hole 13. A fixing member 62 passes through the first fixing hole 56 and is fixed in the second fixing hole 13 to fix the fixing portion 54 to the front plate 14. The second fixing hole 13 is a threaded hole. The fixing member 62 is a bolt.

An end of the stopping member 40 is fixed to the first side plate 16. The stopping member 40 includes a stopping plate 44 and a restricting plate 46 formed at an end of the stopping plate 44 away from the front plate 14. The stopping portion 42 protrudes from the stopping plate 44. The stopping plate 44 defines a buckle hole 48 opposite to the first side plate 16. The restricting plate 46 defines a restricting hole 41 opposite to the front plate 14. An end of the sliding member 70 away from the front plate 14 passes though the restricting hole 41 and is slidably disposed outside of the restricting hole 41. The abutting portion 72 includes a wedge 74. When the stopping portion 42 passes through the through hole 12, the wedge 74 is latched with the buckle hole 48. When the stopping portion 42 is pushed out of the through hole 12, the wedge 74 separates from the buckle hole 48 and the abutting portion 72 abuts a side of the stopping plate 44 apposite to the first side plate 16.

The second side plate 18 defines an arcuate restricting groove 15. The sliding member defines a sliding groove 76. The operating member 50 includes a restricting portion 58. The restricting portion 58 passes through the restricting groove 15 and is slidably received in the sliding groove 76.

The restricting groove 15 is positioned at a side of the rotating shaft 60 away from the front plate 14. The restricting groove 15 includes a first restricting end 17 adjacent to the first side plate 16 and the front plate 14 and a second restricting end 19 away from the first side plate 16 and the front plate 14. The sliding groove 76 includes a first sliding end 78 adjacent to the first side plate 16 and a second sliding end 80 away from the first side plate 16. The second sliding end 80 is closer than the second restricting end 19 to the front plate 14.

When the operating member 50 rotates in the first direction, the restricting portion 58 slides along the restricting groove 15 from the first restricting end 17 and abuts the edge of the sliding groove 76. The restricting portion 58 is thus driven to slide from the first sliding end 78 toward the second sliding end 80 and the sliding member 70 slides away from the front plate 14. When the sliding member 70 slides away from the front plate 14, the wedge 74 moves away from the front plate 14 to abut an edge of the buckle hole 48 and the stopping plate 44 moves away from the first side plate 16 to drive the stopping portion 42 out from the though hole 12.

When the operating member 50 rotates in direction opposite to the first direction, the restricting portion 58 slides along the restricting groove 15 from the second restricting end 19 and abuts the edge of the sliding groove 76. The restricting portion 58 is thus driven to slide from the second sliding end 80 toward the first sliding end 78 and the sliding member 70 slides close to the front plate 14. When the sliding member 70 slides close to the front plate 14, the wedge 74 moves close to the front plate 14 to lock in the buckle hole 48 and the stopping plate 44 rebounds toward first side plate 16 to drive the stopping portion 42 to be received in and pass through the though hole 12.

The exemplary embodiments shown and described above are only examples. Even though numerous descriptions and advantages of the present technology have been set forth in the foregoing description, together with details of the structure and function of the present disclosure, the disclosure is illustrative only, and changes may be made in the details, including in matters of shape, size, and arrangement of the parts within the principles of the present disclosure, up to and including the full extent established by the broad general meaning of the terms used in the claims.

What is claimed is:

1. A case comprising:
   a shell defining a through hole;
   an elastic stopping member comprising a stopping portion;
   a sliding member comprising an abutting portion; and
   an operating member rotatably fixed to the shell and slidably connected to the sliding member, wherein the operating member rotates in a first direction to drive the sliding member to slide in a second direction and the abutting portion abuts the stopping portion to separate from the through hole, the operating member rotates in a direction opposite to the first direction to drive the sliding member to slide in a direction opposite to the second direction and moves the stopping portion to be received in and pass through the through hole.

2. The case as claimed in claim 1, wherein the shell defines an arcuate restricting groove, the sliding member defines a sliding groove, the operating member comprises a restricting portion, the restricting portion passes through the restricting groove and is slidably received in the sliding groove.

3. The case as claimed in claim 2, wherein the shell comprises a front plate, a first side plate and a second side plate, the first side plate and the second side plate are connected two adjacent sides of the front plate, the through hole is defined on the first side plate, the restricting groove is defined on the second side plate.

4. The case as claimed in claim 3, wherein an end of the stopping member is fixed to the first side plate, the stopping member comprises a stopping plate and a restricting plate bended from an end of the stopping plate away from the front plate, the stopping portion protrudes from the stopping plate, the restricting plate defines a restricting hole opposite to the front plate, an end of the sliding member away from the front plate passes though the restricting hole and is slidably disposed outside of the restricting hole.

5. The case as claimed in claim 3, wherein the stopping plate defines a buckle hole opposite to the first side plate, the abutting portion comprises a wedge, when the stopping portion passes through the through hole, the wedge is latched with the buckle hole, when the stopping portion leaves out of the through hole, the wedge leaves out of the buckle hole and the abutting portion abuts a side of the stopping plate apposite to the first side plate.

6. The case as claimed in claim 3, wherein an end of the second side plate adjacent to the front plate defines a first hole, the operating member defines a second hole, a rotating shaft is fixed in the first hole and received in the second hole.

7. The case as claimed in claim 6, wherein the restricting groove is positioned at a side of the rotating shaft away from the front plate, the restricting groove comprises a first restricting end adjacent to the first side plate and the front plate and a second restricting end away from the first side plate and the front plate, the sliding groove comprises a first sliding end adjacent to the first side plate and a second sliding end away from the first side plate, the second sliding end is closer to the front plate than the second restricting end.

8. The case as claimed in claim 3, wherein the operating member comprises a fixing portion, when the operating member rotates to drive the stopping portion to pass through the through hole, the fixing portion is fixed to the front plate.

9. The case as claimed in claim 8, wherein the fixing portion defines a first fixing hole, The front plate defines a second fixing hole, when the operating member rotates to drive the stopping portion to pass through the through hole, the first fixing hole is aligned to the second fixing hole, a fixing member passes through the first fixing hole and is fixed in the second fixing hole to fix the fixing portion to the front plate.

10. The case as claimed in claim 9, wherein the second fixing hole is a screwed hole, the fixing member is a bolt.

11. A case comprising:
    a shell comprising a first side plate and a second side plate perpendicular connected to the first side plate, the first side plate defining a through hole;
    an elastic stopping member comprising a stopping portion;
    a sliding member comprising an abutting portion; and
    an operating member rotatably fixed to the second side plate and slidably connected to the sliding member, wherein the operating member rotates in a first direction to drive the sliding member to slide in a second direction and the abutting portion abuts the stopping portion to separate from the through hole, the operating member rotates in a direction opposite to the first direction to drive the sliding member to slide in a direction opposite to the second direction and the stopping portion moves to be received in and pass through the through hole.

12. The case as claimed in claim 11, wherein the shell defines an arcuate restricting groove, the sliding member defines a sliding groove, the operating member comprises a restricting portion, the restricting portion passes through the restricting groove and is slidably received in the sliding groove.

13. The case as claimed in claim 12, wherein the shell further comprises a front plate, the first side plate and the second side plate are connected two adjacent sides of the front plate, the restricting groove is defined on the second side plate.

14. The case as claimed in claim 13, wherein an end of the stopping member is fixed to the first side plate, the stopping member comprises a stopping plate and a restricting plate formed at an end of the stopping plate away from the front plate, the stopping portion protrudes from the stopping plate, the restricting plate defines a restricting hole opposite to the front plate, an end of the sliding member away from the front plate passes though the restricting hole and is slidably disposed outside of the restricting hole.

15. The case as claimed in claim 13, wherein the stopping plate defines a buckle hole opposite to the first side plate, the abutting portion comprises a wedge, when the stopping portion passes through the through hole, the wedge is latched with the buckle hole, when the stopping portion leaves out of the through hole, the wedge leaves out of the buckle hole and the abutting portion abuts a side of the stopping plate apposite to the first side plate.

16. The case as claimed in claim 13, wherein an end of the second side plate adjacent to the front plate defines a first hole, the operating member defines a second hole, a rotating shaft is fixed in the first hole and received in the second hole.

17. The case as claimed in claim 16, wherein the restricting groove is positioned at a side of the rotating shaft away from the front plate, the restricting groove comprises a first restricting end adjacent to the first side plate and the front plate and a second restricting end away from the first side plate and the front plate, the sliding groove comprises a first sliding end adjacent to the first side plate and a second sliding end away from the first side plate, the second sliding end is closer to the front plate than the second restricting end.

18. The case as claimed in claim 13, wherein the operating member comprises a fixing portion, when the operating member rotates to drive the stopping portion to pass through the through hole, the fixing portion is fixed to the front plate.

19. The case as claimed in claim 18, wherein the fixing portion defines a first fixing hole, The front plate defines a second fixing hole, when the operating member rotates to drive the stopping portion to pass through the through hole, the first fixing hole is aligned to the second fixing hole, a fixing member passes through the first fixing hole and is fixed in the second fixing hole to fix the fixing portion to the front plate.

20. The case as claimed in claim 19, wherein the second fixing hole is a screwed hole, the fixing member is a bolt.

* * * * *